(12) United States Patent
Koyama et al.

(10) Patent No.: US 9,536,709 B2
(45) Date of Patent: Jan. 3, 2017

(54) PLASMA GENERATOR

(71) Applicant: CREATIVE TECHNOLOGY CORPORATION, Kawasaki-shi, Kanagawa (JP)

(72) Inventors: Satomi Koyama, Kawasaki (JP); Li Luo, Kawasaki (JP); Yoshiaki Tatsumi, Kawasaki (JP)

(73) Assignee: CREATIVE TECHNOLOGY CORPORATION, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/763,931

(22) PCT Filed: Jan. 9, 2014

(86) PCT No.: PCT/JP2014/050262
§ 371 (c)(1),
(2) Date: Jul. 28, 2015

(87) PCT Pub. No.: WO2014/119349
PCT Pub. Date: Aug. 7, 2014

(65) Prior Publication Data
US 2015/0371829 A1    Dec. 24, 2015

(30) Foreign Application Priority Data

Feb. 4, 2013    (JP) .................................. 2013-019918

(51) Int. Cl.
*H01J 37/32*    (2006.01)
*H05H 1/24*    (2006.01)

(52) U.S. Cl.
CPC ....... *H01J 37/32348* (2013.01); *H05H 1/2406* (2013.01); *H01J 2237/335* (2013.01);
(Continued)

(58) Field of Classification Search
None
See application file for complete search history.

(56) References Cited

U.S. PATENT DOCUMENTS

| | | | | |
|---|---|---|---|---|
| 2006/0042545 | A1* | 3/2006 | Shibata | H01J 37/32009 118/722 |
| 2009/0051272 | A1* | 2/2009 | Fukuda | B32B 15/08 313/504 |

(Continued)

FOREIGN PATENT DOCUMENTS

| | | |
|---|---|---|
| CN | 101279101 A | 10/2008 |
| CN | 101636812 A | 1/2010 |

(Continued)

OTHER PUBLICATIONS

International Search Report dated Mar. 11, 2014, issued in counterpart International Application No. PCT/JP2014/050262 (2 pages).

(Continued)

*Primary Examiner* — Ashok Patel
(74) *Attorney, Agent, or Firm* — Westerman, Hattori, Daniels & Adrian, LLP

(57) ABSTRACT

A large-sized plasma generator is suited to various surface shapes and has a longer service life and improved energy conservation. An example of the plasma generator (1-1) has a dielectric layer (3), first and second electrodes (4, 5) that are formed within the dielectric layer, an alternating-current power supply (6), and a first metal layer (7). The dielectric layer (3) is composed of polymer resin layers (31, 32) that are formed of a polyimide resin. The electrodes are arranged side by side within the dielectric layer. The first metal layer is formed of a metal having a sterilization effect, and has a plurality of pores (71) in the surface. The first metal layer spans between supporting parts (33, 34) of the polymer resin (Continued)

layer (32), and faces the whole of the electrodes. A gap (S) is formed between the first metal layer and the polymer resin layer.

6 Claims, 6 Drawing Sheets

(52) U.S. Cl.
CPC ............... *H05H 2001/2418* (2013.01); *H05H 2245/1225* (2013.01)

(56) References Cited

U.S. PATENT DOCUMENTS

| | | | |
|---|---|---|---|
| 2010/0015358 A1* | 1/2010 | Cernak | H01J 37/32348 |
| | | | 427/576 |
| 2010/0065415 A1* | 3/2010 | Sato | A61L 2/14 |
| | | | 204/157.15 |
| 2010/0127624 A1* | 5/2010 | Roy | B64C 23/005 |
| | | | 315/111.21 |
| 2012/0288405 A1 | 11/2012 | Snowball | |
| 2013/0075382 A1* | 3/2013 | Roy | G01M 9/04 |
| | | | 219/201 |

FOREIGN PATENT DOCUMENTS

| | | |
|---|---|---|
| JP | 2005-123159 A | 5/2005 |
| JP | 2005-243905 A | 9/2005 |
| JP | 2006-331664 A | 12/2006 |
| JP | 2009-64993 A | 3/2009 |
| TW | 1262894 B | 10/2006 |
| WO | 2007/032172 A1 | 3/2007 |
| WO | 2008069766 A2 | 6/2008 |

OTHER PUBLICATIONS

Extended European Search Report dated Oct. 28, 2015 issued in counterpart European patent application No. 14746259.2. (7 pages).

* cited by examiner

PLASMA GENERATOR

TECHNICAL FIELD

The present invention relates to a plasma generator capable of performing sterilization, surface modification, deodorization, and cleaning by using dielectric barrier discharge plasma.

BACKGROUND ART

The dielectric barrier discharge is such that electric discharge is generated in gases by applying an alternating voltage between electrodes via a dielectric, and by the plasma, sterilization, surface modification, deodorization, and cleaning can be performed.

As a type of such dielectric barrier discharge, there is a surface discharge technique in which two comb-shaped or two flat-plate electrodes are provided side by side within a single dielectric and an alternating voltage is applied between these two electrodes to electrically discharge (see PLT 1 and 2, etc., for example).

It is common in a plasma generator using such dielectric barrier discharge that ceramic is used for a dielectric layer and electric discharge at high voltage is performed.

CITATION LIST

Patent Literature

PLT 1: Japanese Published Unexamined Patent Application No. 2006-331664
PLT 2: Japanese Published Unexamined Patent Application No. 2009-064993

SUMMARY OF THE INVENTION

Technical Problem

However, the foregoing conventional plasma generator has the following problems.

Since ceramic is used for the dielectric layer in the foregoing conventional plasma generator, the dielectric layer lacks flexibility. As a result, manufacturing of a large-sized plasma generator having a desired surface shape is difficult. Therefore, in order to form the plasma generator requiring a large processing area into a desired shape, it is necessary to arrange a plurality of compact discharging devices side by side. As a result, disadvantageously, wiring of the plasma generator is enormous and complicated, and the manufacturing work requires a large amount of labor, and manufacturing costs become higher. In addition, there is also a problem in terms of energy conservation since high voltage is applied to electrically discharge.

In response thereto, a technique can be proposed that the dielectric layer used in the surface discharge type plasma generator is formed of a polymer resin having high heat resistance and high permittivity.

The polymer resin is high in flexibility and can form the dielectric layer into a thin film form. Thus, the plasma generator requiring a large processing area can be made in a desired shape easily.

Meanwhile, in order to continuously perform the dielectric barrier discharge on the surface of the dielectric to produce a plasma stably and extensively, the alternating voltage at high voltage needs to be applied between the two electrodes.

However, the polymer resin has a lower durability to voltage than the ceramic, and the plasma generator using the polymer resin for the dielectric layer has a short service life. Moreover, the polymer resin cannot be used for the dielectric layer in a plasma generator requiring a discharge voltage close to a dielectric breakdown voltage of the polymer resin.

Therefore, although the large-sized plasma generator suited to various surface shapes can be manufactured by using the polymer resin excellent in flexibility for the dielectric layer, a problem arises in terms of service life of the device and energy conservation due to the need to apply the high voltage.

The present invention was made to solve the foregoing problems, and accordingly an object thereof is to allow for manufacturing of a large-sized device suited to various surface shapes and to provide a plasma generator allowing for a longer service life and improved energy conservation.

Solution to the Problems

In order to solve the foregoing problems, the invention of claim 1 is a plasma generator comprising a dielectric layer, first and second electrodes arranged side by side within the dielectric layer, and a power supply for applying a predetermined voltage to the first and second electrodes, wherein the dielectric layer is formed of a polymer resin having high heat resistance and high permittivity, and a first metal layer is arranged spaced apart a predetermined distance from a surface of the dielectric layer and is made to face the first and second electrodes so as to cover the entire first and second electrodes from the surface side of the dielectric layer.

With this configuration, the polymer resin high in flexibility is used, so that the dielectric layer having a large area and a desired shape can be formed.

Once, for example, the alternating voltage is applied to the first and second electrodes by the power supply, the first electrode and the second electrode are brought into a state of having mutually opposite polarities.

At this time, the first metal layer faces the first and second electrodes so as to cover the entire first and second electrodes. Therefore, when the first electrode is in a positive-polarity (or negative-polarity) state, a region of the first metal layer which faces this first electrode is brought into a negative-polarity (or positive-polarity) state. As a result, the dielectric barrier discharge is generated between the entire surface of the first electrode and the facing region of the first metal layer. On the other hand, since the second electrode is in a negative-polarity (or positive-polarity) state, a region of the first metal layer which faces this second electrode is brought into a positive-polarity (or negative-polarity) state. As a result, the dielectric barrier discharge is generated between the entire surface of the second electrode and the facing region of the first metal layer.

Accordingly, the dielectric barrier discharge is generated between almost the entire surfaces of the first and second electrodes and almost the entire surface of the first metal layer, and a plasma is generated in almost the entire region of a gap between the first metal layer and the dielectric layer.

In the surface discharge where the electric discharge is performed directly between the side-by-side first and second electrodes, a considerably high voltage is needed to generate the plasma stably and extensively. However, the stable and extensive plasma can be generated at low voltage by using the plasma generator of the present invention, as described above.

Consequently, the deterioration of the resin is small due to the low voltage discharge, and a longer service life of the device is allowed. In addition, driving at low voltage is possible, so that the amount of energy consumption can be reduced as well.

The invention of claim 2 is the plasma generator according to claim 1, wherein a second metal layer is arranged spaced apart a predetermined distance from a back surface of the dielectric layer and is made to face the first and second electrodes so as to cover the entire first and second electrodes from the back surface side of the dielectric layer.

With this configuration, the dielectric barrier discharge is generated not only between almost the entire surfaces of the first and second electrodes and almost the entire surface of the first metal layer but also between almost the entire surfaces of the first and second electrodes and almost the entire surface of the second metal layer, and a plasma is generated not only in almost the entire region of the gap between the first metal layer and the dielectric layer but also in almost the entire region of a gap between the second metal layer and the dielectric layer.

The invention of claim 3 is the plasma generator according to claim 1 or 2, wherein the metal layer is provided with a plurality of holes for flowing out a fluid produced in a gap between the metal layer and the dielectric layer toward a surface of the metal layer.

With this configuration, the fluid such as ozone, radical, or the like produced in the gap between the metal layer and the dielectric layer by the dielectric barrier discharge can flow out to the outside through the holes of the metal layer. As a result, by arranging a workpiece in the vicinity of the metal layer, the workpiece can be subjected to sterilization, surface modification, deodorization, and cleaning.

The invention of claim 4 is the plasma generator according to claim 3, wherein the metal layer is formed in a mesh shape.

The invention of claim 5 is the plasma generator according to any one of claims 1 to 4, wherein the metal layer is formed of a metal having a sterilization action.

With this configuration, metal ions having sterilization properties are produced from the metal layer and mixed with the fluid such as ozone, radical, or the like having been produced in the gap between the metal layer and the dielectric layer. As a result, the sterilization effect on the workpiece can be further enhanced.

The invention of claim 6 is the plasma generator according to any one of claims 1 to 5, wherein the polymer resin is any one of a polyimide resin, a fluorine-based resin, and a silicone resin.

Effects of the Invention

As described in detail hereinbefore, with the plasma generator of the present invention, there are beneficial effects of not only allowing for manufacturing of the device having the dielectric layer with a large area and a desired shape but also allowing for a longer service life of the device and improved energy conservation due to the low voltage discharge.

In particular, with the plasma generator according to the invention of claim 2, the plasma can be generated in the regions on both sides of the dielectric layer, so that there is an effect that ozone or the like can be diffused widely.

Further, with the plasma generators according to the inventions of claim 3 and claim 5, there is an effect that effective sterilization with respect to the workpiece becomes possible.

DESCRIPTION OF THE EMBODIMENTS

Hereinafter, the best mode of the present invention will be described with reference to the drawings.
(First Embodiment)

Figure 1:
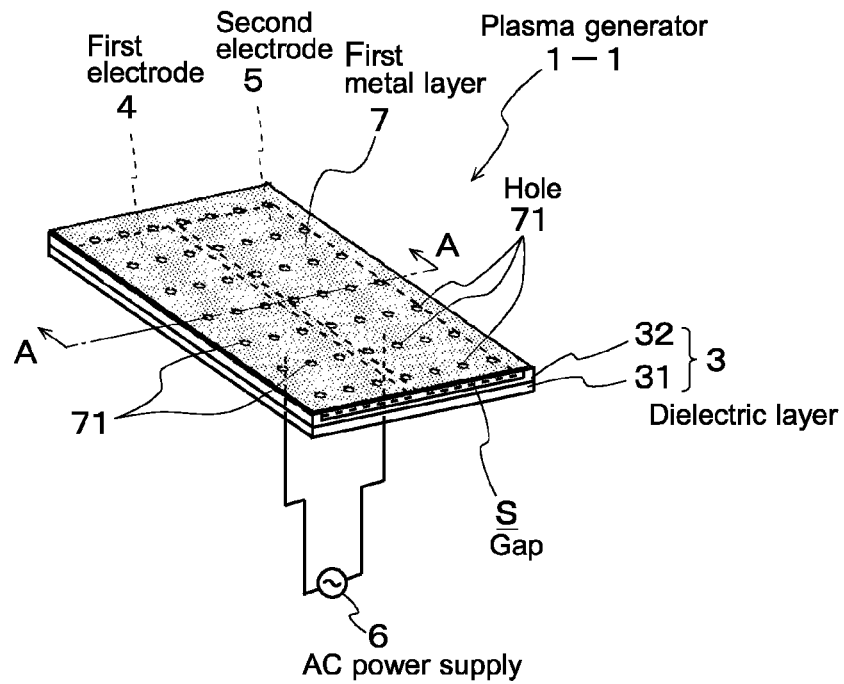
FIG. 1 is a perspective view of a plasma generator according to the first embodiment of the present invention.
Figure 2:
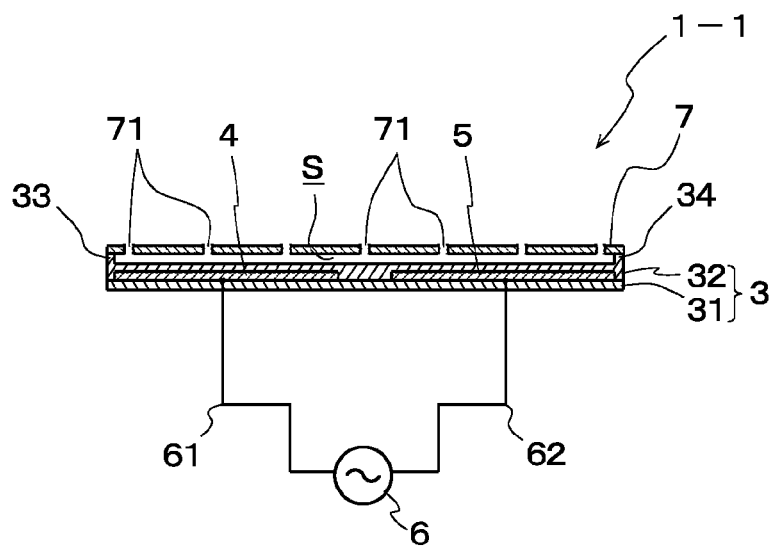
FIG. 2 is a cross sectional view taken along arrow A-A in FIG. 1.
Figure 3:
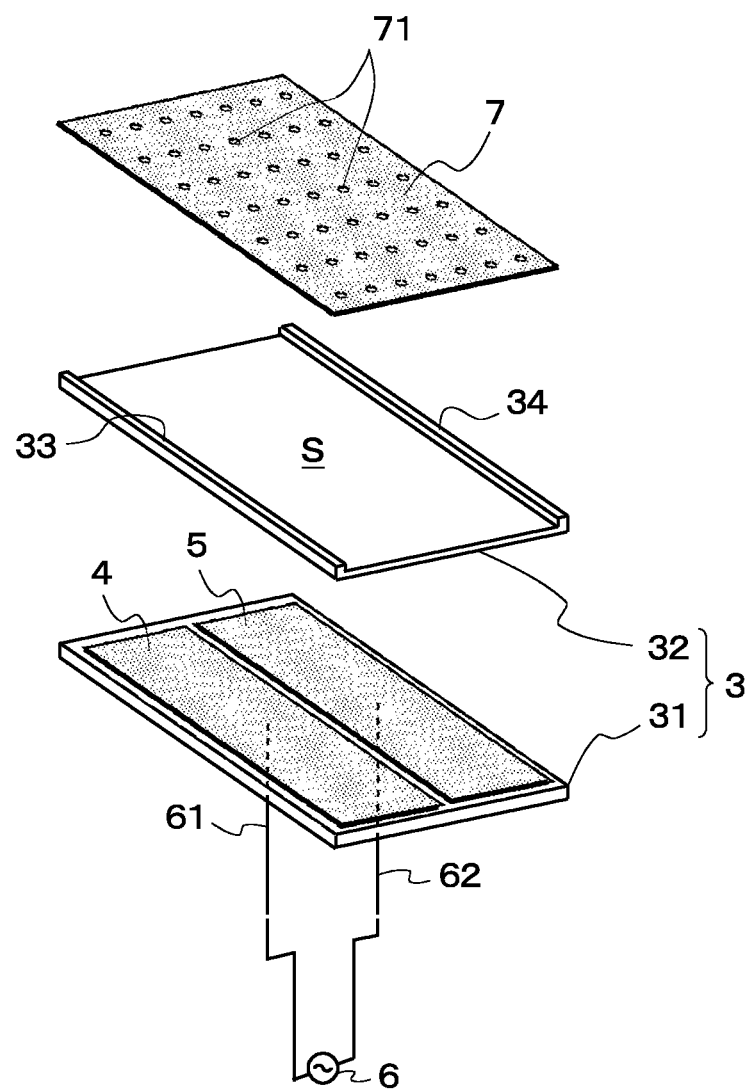
FIG. 3 is an exploded perspective view of the plasma generator.

FIG. 1 is a perspective view of a plasma generator according to the first embodiment of the present invention. FIG. 2 is a cross sectional view taken along arrow A-A in FIG. 1. FIG. 3 is an exploded perspective view of the plasma generator.

A plasma generator 1-1 shown in FIG. 1 is a device for generating a plasma by dielectric barrier discharge, and includes a dielectric layer 3, first and second electrodes 4 and 5 formed within the dielectric layer 3, an alternating-current power supply (hereinafter, referred to as AC power supply) 6, and a first metal layer 7.

As shown in FIG. 2, the dielectric layer 3 is a layer body for insulating the first and second electrodes 4 and 5 and is composed of polymer resin layers 31 and 32.

Specifically, the first and second electrodes 4 and are laminated on the polymer resin layer 31. The polymer resin layer 32 is laminated on the polymer resin layer 31 so as to cover the entire first and second electrodes 4 and 5.

In this embodiment, the polymer resin layers 31 and are formed of a polyimide resin which is a polymer resin having high heat resistance and high permittivity.

As shown in FIG. 3, the first and second electrodes 4 and 5 are flat-plate layer bodies of the same shape and arranged side by side on the polymer resin layer 31 so as to be in parallel therewith.

The AC power supply 6 is a power supply for applying an alternating voltage to the first and second electrodes 4 and 5. The AC power supply 6 has one of input and output terminals connected to the first electrode 4 through wiring 61 and the other input and output terminal connected to the second electrode 5 through wiring 62.

The first metal layer 7 is a rectangular layer body of the same shape as the dielectric layer 3 and is formed of a metal having a sterilization action. For example, the first metal layer 7 can be formed of silver, copper, zinc, aluminum, lead, gold, or the like.

Specifically, supporting parts 33 and 34 having a predetermined height are formed on both edge portions of the polymer resin layer 32 by blasting or the like, and the first metal layer 7 is formed so as to be laid on the supporting parts 33 and 34. As a result, the first metal layer 7 faces the first and second electrodes 4 and 5 while covering the entire first and second electrodes 4 and 5 from the surfaces. This first metal layer 7 and the polymer resin layer 32 define a gap S that passes gas such as air.

Further, a plurality of holes 71 are provided on the surface of such first metal layer 7. These holes 71 are holes for flowing out a fluid generated within the gap S to the outside of the surface of the first metal layer 7. In this embodiment, the holes 71 are each formed in a substantially square shape and are arrayed on the first metal layer 7 at regular intervals.

Next, operation and effects exhibited by the plasma generator 1-1 of this embodiment will be described.

Figure 4:
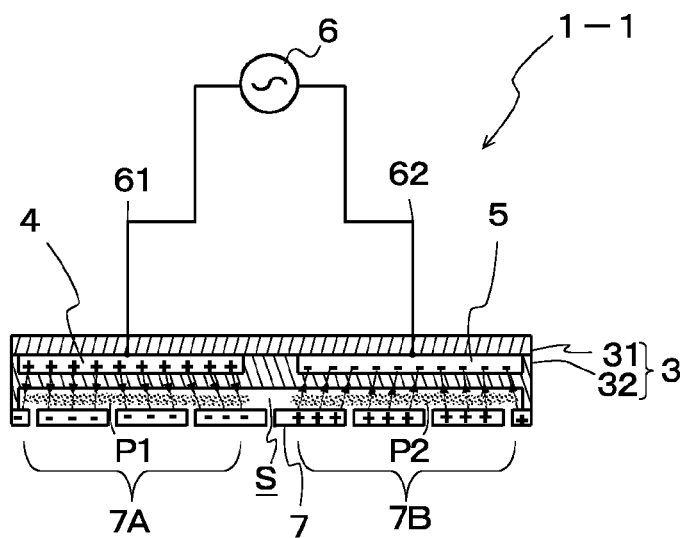
FIG. 4 is a schematic cross sectional view showing a plasma generation state by the plasma generator of the embodiment.
Figure 5:
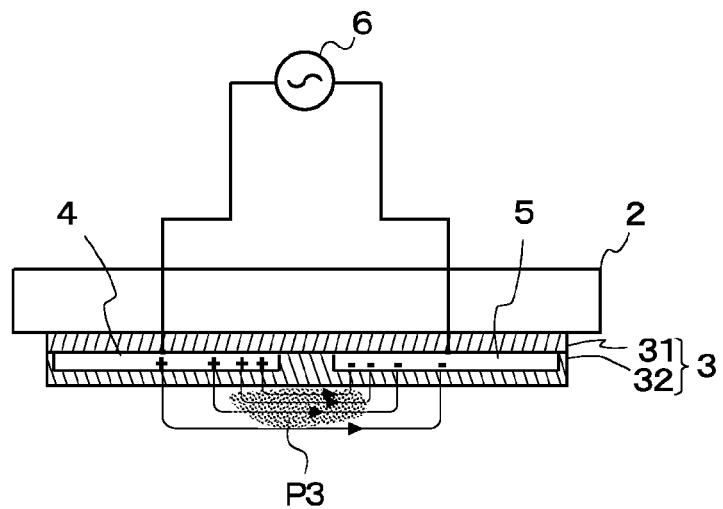
FIG. 5 is a schematic cross sectional view showing a plasma generation state by the general surface discharge.

FIG. 4 is a schematic cross sectional view showing a plasma generation state by the plasma generator of the embodiment. FIG. 5 is a schematic cross sectional view showing a plasma generation state by the general surface discharge.

As shown in FIG. 4, upon switch-on of the AC power supply 6 with the plasma generator 1-1 oriented downward, the alternating voltage is applied to the first and second electrodes 4 and 5 through the wiring 61 and 62.

Upon application of the alternating voltage, the first and second electrodes 4 and 5 are brought into a state of having mutually opposite polarities. For example, when the first electrode 4 has a positive polarity, the second electrode 5 results in a negative polarity, as shown.

At this time, the first metal layer 7 faces the first and second electrodes 4 and 5 so as to cover the whole of them. Thus, a region 7A of the first metal layer 7 which faces the positive first electrode 4 is brought into the negative-polarity state. As a result, the dielectric barrier discharge similar to the parallel plate discharge is generated between the first electrode 4 and the region 7A of the first metal layer 7, and a plasma P1 is generated across the entire surface of the first electrode 4 within the gap S.

On the other hand, a region 7B of the first metal layer 7 which faces the negative second electrode 5 is brought into the positive-polarity state. As a result, the dielectric barrier discharge similar to the parallel plate discharge is generated between the second electrode 5 and the region 7B of the first metal layer 7, and a plasma P2 is generated across the entire surface of the second electrode 5 within the gap S.

Accordingly, upon driving of the plasma generator 1-1 of this embodiment, the plasmas P1 and P2 can be generated on the entire surface regions of the first and second electrodes 4 and 5, that is, almost the entire region of the gap S.

Meanwhile, the dielectric barrier discharge which is the surface discharge is performed in the general plasma generator having no first metal layer 7 as shown in FIG. 5. Reference symbol 2 denotes a base material in FIG. 5.

That is, once the plasma generator in FIG. 5 is driven at the same potential as that of the drive voltage of the plasma generator 1-1 of this embodiment, the dielectric barrier discharge by the surface discharge is generated between the first and second electrodes 4 and 5, and a plasma P3 is generated at a boundary part between the first and second electrodes 4 and 5.

Thus, in order to generate the plasma P3 stably across the entire surface regions of the first and second electrodes 4 and 5, the alternating voltage significantly higher than the drive voltage of the plasma generator 1-1 needs to be applied to the first and second electrodes 4 and 5. Such application of the high voltage causes a deterioration or dielectric breakdown of the dielectric layer 3, reduces the service life of the device, and causes an increase in energy consumption.

On the other hand, in the plasma generator 1-1 of this embodiment, the surface discharge is performed on the back surface (the upper surface side in FIG. 4) of the polymer resin layer 31 but a discharge similar to the parallel plate discharge is performed within the gap S on the surface (the under surface side in FIG. 4) of the polymer resin layer 32 as described above. Therefore, the plasmas P1 and P2 can be generated stably at low alternating voltage across the entire surface regions of the first and second electrodes 4 and 5. Accordingly, it is less likely to cause a deterioration or dielectric breakdown of the dielectric layer 3, and a longer service life of the device and a reduction in the amount of energy consumption can be achieved.

Figure 6:
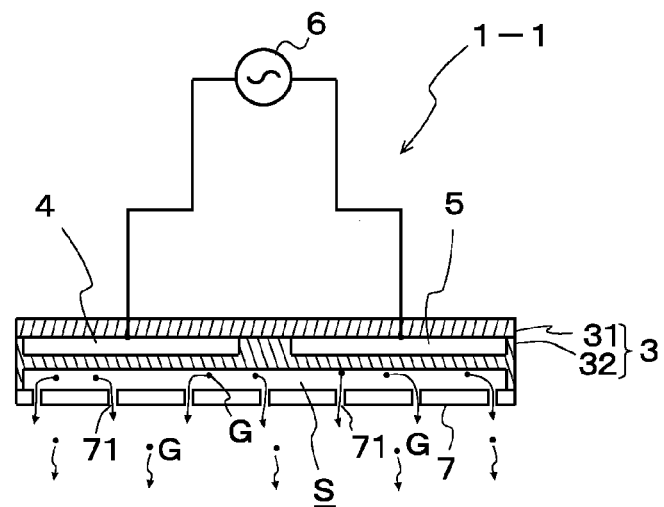
FIG. 6 is a schematic cross sectional view showing an outflow state of a fluid.

FIG. 6 is a schematic cross sectional view showing an outflow state of a fluid.

As shown in FIG. 4, upon generation of the plasmas P1 and P2 in almost the entire region of the gap S of the plasma generator 1-1, a fluid G such as ozone, radical, or the like is produced as shown in FIG. 6.

This fluid G flows out to the outside of the plasma generator 1-1 from the holes 71 of the first metal layer 7. Thus, by arranging a workpiece (not shown) in the vicinity of the downside of the first metal layer 7, the workpiece can be subjected to sterilization, surface modification, deodorization, and cleaning.

Furthermore, the first metal layer 7 is formed of silver, copper, zinc, aluminum, lead, gold, or the like in this embodiment. Therefore, upon driving of the plasma generator 1-1, metal ions having high sterilization properties jump out of the first metal layer 7 and are mixed with the fluid G such as ozone, radical, or the like having flown out of the holes 71 of the first metal layer 7. As a result, the sterilization effect on the workpiece is further enhanced.

With the plasma generator 1 of this embodiment, the dielectric layer 3 is formed of polymer resin, so that the dielectric layer 3 having a large area can be formed as compared to the case where the dielectric layer 3 is formed of ceramic.

(Second Embodiment)

Next, the second embodiment of the present invention will be described.

Figure 7:
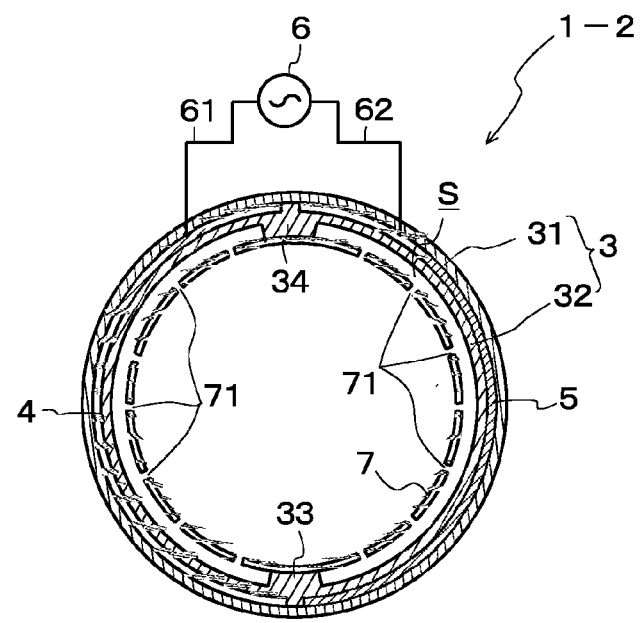
FIG. 7 is a cross sectional view showing a plasma generator according to the second embodiment of the present invention.

FIG. 7 is a cross sectional view showing a plasma generator according to the second embodiment of the present invention.

This embodiment differs from the foregoing first embodiment in that the plasma generator is manufactured by taking advantage of flexibility of the polymer resin.

That is, the device having the dielectric layer 3 with a large area can be manufactured by forming the dielectric layer 3 of the polymer resin, as in the plasma generator 1-1 of the foregoing first embodiment. In this embodiment, a cylindrical plasma generator 1-2 can be manufactured as shown in FIG. 7 by taking advantage of flexibility of the polymer resin.

Specifically, the dielectric layer 3 with the first and second electrodes 4 and 5 sandwiched between the polymer resin layers 31 and 32 is formed. The first metal layer 7 having a plurality of holes 71 is formed so as to be laid on the supporting parts 33 and 34 of the polymer resin layer 32. This dielectric layer 3 and the first metal layer 7 are integrally formed in a cylindrical shape with the first metal layer 7 placed inside. Thus, the dielectric layer 3 is formed of the polymer resin high in flexibility, whereby the plasma generator having various surface shapes can be manufactured. In this embodiment, the dielectric layer 3 and the first metal layer 7 are curved in the cylindrical shape to manufacture the plasma generator 1-2. However, the dielectric layer 3 can be formed in a circle to manufacture a disc-shaped plasma generator as well.

The other configurations, operation and effects are the same as those of the foregoing first embodiment. Thus, their descriptions are omitted.

(Third Embodiment)

Next, the third embodiment of the present invention will be described.

Figure 8:
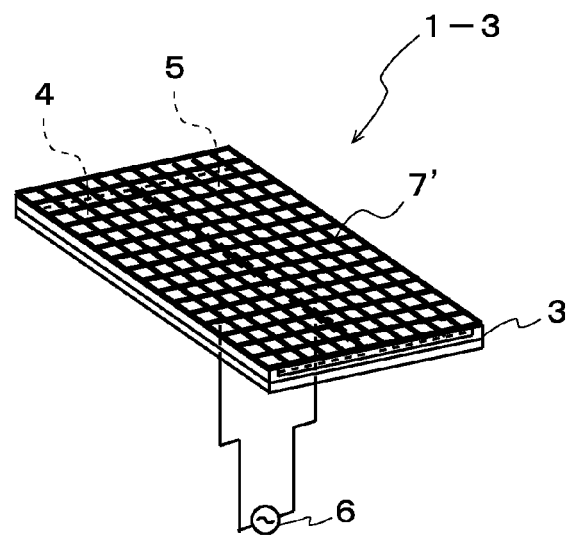
FIG. 8 is a perspective view showing a plasma generator according to the third embodiment of the present invention.

FIG. 8 is a perspective view showing a plasma generator according to the third embodiment of the present invention.

A plasma generator 1-3 of this embodiment differs from those of the foregoing first and second embodiments in the structure of the first metal layer.

That is, a first metal layer 7' in a mesh shape is used instead of the first metal layer 7 having a plurality of holes 71. This first metal layer 7' is arranged above the dielectric layer 3.

The other configurations, operation and effects are the same as those of the foregoing first and second embodiments. Thus, their descriptions are omitted.

(Fourth Embodiment)

Next, the fourth embodiment of the present invention will be described.

Figure 9:
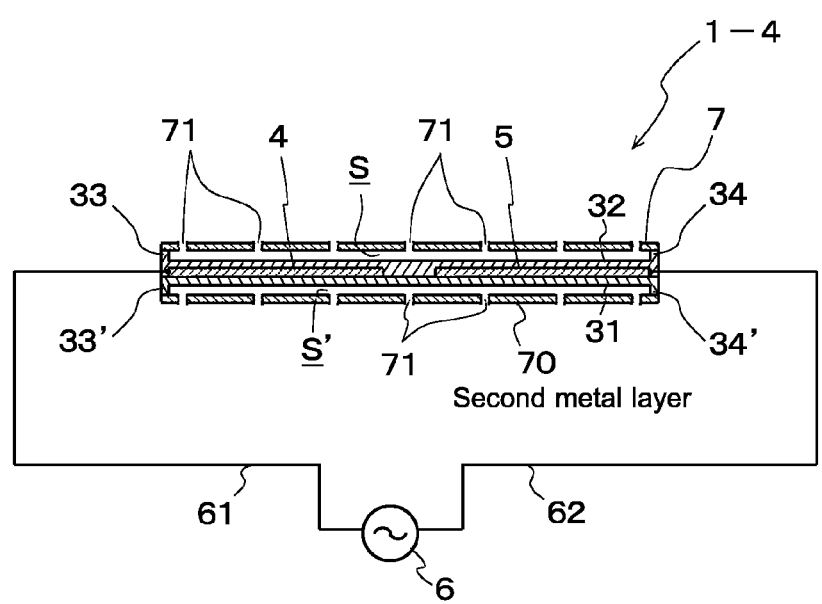
FIG. 9 is a cross sectional view showing a plasma generator according to the fourth embodiment of the present invention.

FIG. 9 is a cross sectional view showing a plasma generator according to the fourth embodiment of the present invention.

A plasma generator 1-4 of this embodiment differs from those of the foregoing first to third embodiments in that the first metal layer is provided to both sides of the dielectric layer 3.

That is, as shown in FIG. 9, supporting parts 33' and 34' having a predetermined height are respectively formed on both edge portions of the back surface of the polymer resin layer 31 which is the back surface of the dielectric layer 3. A second metal layer 70 is formed so as to be laid on these supporting parts 33' and 34'. As a result, the second metal layer 70 faces the first and second electrodes 4 and 5 while covering the entire first and second electrodes 4 and 5 from the back surfaces. This second metal layer 70 and the polymer resin layer 31 define a gap S' which passes gas such as air.

This configuration allows the plasma to be generated stably in almost the entire regions of the gaps S and S'. As a result, ozone or the like produced by the plasmas can be diffused widely from both sides of the plasma generator 1-4.

The other configurations, operation and effects are the same as those of the foregoing first to third embodiments. Thus, their descriptions are omitted.

It is noted that the present invention should not be limited to the foregoing embodiments and various deformations and changes can be made within the scope of the gist of the invention.

Figure 10:
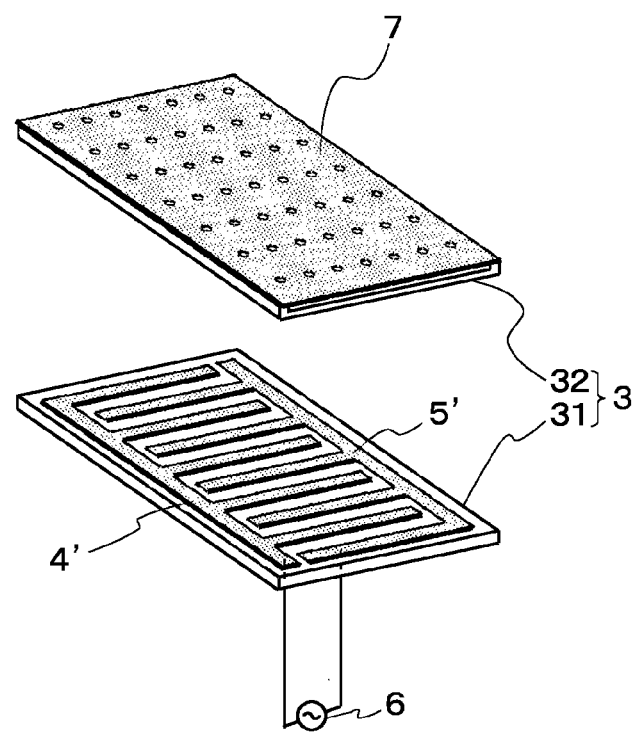
FIG. 10 is an exploded perspective view showing a modification of first and second electrodes.
Figure 11:
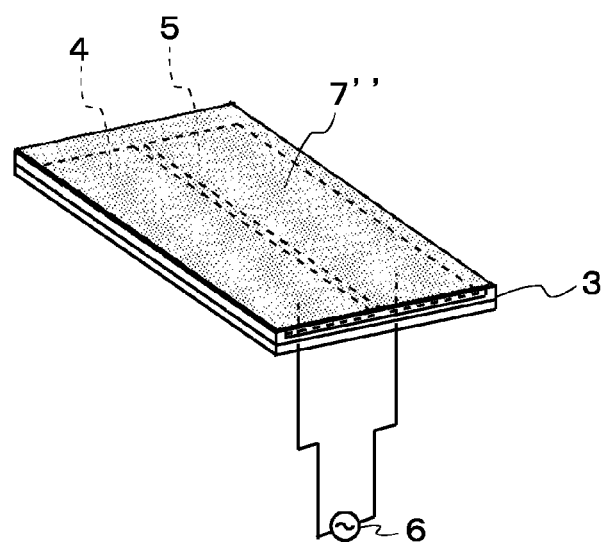
FIG. 11 is a perspective view showing a modification of a metal layer.

For example, the first and second electrodes are formed of two flat-plate layer bodies 4 and 5 of the same shape in the foregoing embodiments, but should not be limited thereto. For example, as shown in FIG. 10, it is also possible that two comb tooth-like electrodes 4' and 5' are applied as the first and second electrodes so that the first and second electrodes 4' and 5' are configured to be engaged with each other.

Further, the polyimide resin is applied as the polymer resin layers 31 and 32 in the foregoing embodiments. However, without being limited thereto, a fluorine-based resin, a silicone resin, or the like can be applied as well.

Further, the plasma generators having the first metal layer 7 with a plurality of holes 71 are exemplified in the foregoing embodiments. However, it is a matter of course that a plasma generator having a first metal layer 7'' without holes is also included in the scope of the present invention.

Furthermore, the AC power supply 6 is applied as the power supply in the foregoing embodiments. However, a concept of the voltage applied to the first and second electrodes includes not only the alternating voltage but also the voltage varying only in the positive direction (or only in the negative direction) such as the pulse voltage which suddenly rises and suddenly drops.

REFERENCE SIGNS LIST 1-1 to 1-4 . . . plasma generator, 3 . . . dielectric layer, 4, 4' . . . first electrode, 5, 5' . . . second electrode, 6 . . . AC power supply, 7, 7', 7'' . . . first metal layer, 31, 32 . . . polymer resin layer, 33, 34, 33', 34' . . . supporting part, 61, 62 . . . wiring, 70 . . . second metal layer, 71 . . . hole, G . . . fluid, P1 to P3 . . . plasma, S, S' . . . gap.

FIG. 1
1-1 Plasma generator
3 Dielectric layer
4 First electrode
5 Second electrode
6 AC power supply
7 First metal layer
71 Hole
S Gap
FIG. 9
70 Second metal layer

The invention claimed is:

1. A plasma generator comprising:
a dielectric layer;
first and second electrodes arranged side by side within the dielectric layer; and
a power supply for applying a predetermined voltage to the first and second electrodes,
wherein the dielectric layer is formed of a polymer resin having high heat resistance and high permittivity, and a first metal layer is arranged spaced apart a predetermined distance from a surface of the dielectric layer and is made to face the first and second electrodes so as to cover the entire first and second electrodes from the surface side of the dielectric layer.

2. The plasma generator according to claim 1, wherein a second metal layer is arranged spaced apart a predetermined distance from a back surface of the dielectric layer and is made to face the first and second electrodes so as to cover the entire first and second electrodes from the back surface side of the dielectric layer.

3. The plasma generator according to claim 1, wherein the metal layer is provided with a plurality of holes for flowing out a fluid produced in a gap between the metal layer and the dielectric layer toward a surface of the metal layer.

4. The plasma generator according to claim 3, wherein the metal layer is formed in a mesh shape.

5. The plasma generator according to claim 1, wherein the metal layer is formed of a metal having a sterilization action.

6. The plasma generator according to claim 1, wherein the polymer resin is any one of a polyimide resin, a fluorine-based resin, and a silicone resin.

* * * * *